(12) United States Patent
Sivertsen (10) Patent No.: US 7,272,013 B1
(45) Date of Patent: Sep. 18, 2007

(54) INTERCHANGEABLE DESIGN SUPPORT SYSTEM

(75) Inventor: Clas G. Sivertsen, Lilburn, GA (US)

(73) Assignee: American Megatrends, Inc., Norcross, GA (US)

( * ) Notice: Subject to any disclaimer, the term of this patent is extended or adjusted under 35 U.S.C. 154(b) by 8 days.

(21) Appl. No.: 11/191,521

(22) Filed: Jul. 28, 2005

(51) Int. Cl.
*H05K 7/18* (2006.01)

(52) U.S. Cl. .................. 361/752; 361/730; 361/679; 361/686; 361/724; 361/796; 174/520; 211/41.17

(58) Field of Classification Search ............... 361/728, 361/730, 752, 796, 686, 600, 679, 683, 724, 361/725, 788; 174/520, 521; 211/41.17
See application file for complete search history.

(56) References Cited

U.S. PATENT DOCUMENTS

| | | | | |
|---|---|---|---|---|
| 6,061,244 A | * | 5/2000 | O'Sullivan et al. | 361/727 |
| 6,157,534 A | * | 12/2000 | Gallagher et al. | 361/683 |
| 6,556,438 B1 | * | 4/2003 | Bolognia et al. | 361/687 |
| 6,614,979 B2 | * | 9/2003 | Bourdeau | 385/135 |
| 6,739,896 B2 | * | 5/2004 | Sivertsen | 439/371 |
| 6,741,477 B2 | * | 5/2004 | Sivertsen | 361/752 |
| 6,894,906 B2 | * | 5/2005 | Sivertsen | 361/796 |
| 6,943,150 B1 | * | 9/2005 | Altieri | 514/21 |

* cited by examiner

*Primary Examiner*—Tuan Dinh
*Assistant Examiner*—Dameon E. Levi
(74) *Attorney, Agent, or Firm*—Hope Baldauff Hartman, LLC (57) ABSTRACT

A support system comprising a chassis having an interchangeable design and layout is disclosed. The support system further includes a front panel, a rear panel, an indicator segment, and an outlet segment. The indicator and outlet segments are detachably mounted to the chassis such that a user can convert the chassis to a front or a rear access position. It is noted that this abstract is provided to comply with the rules requiring an abstract that will allow a searcher or other reader to ascertain quickly the subject matter of the technical disclosure and is not be used to interpret or limit the scope or meaning of the claims.

20 Claims, 6 Drawing Sheets

INTERCHANGEABLE DESIGN SUPPORT SYSTEM

BACKGROUND OF THE INVENTION

1. Field of the Invention

The present invention generally relates to a support system for housing a variety of types of electronic components and, more particularly, to a support system comprising a chassis with an interchangeable design and layout.

2. Background

Chassis are utilized to house a variety of different types of electronic components. For instance, a chassis may be utilized to hold CPUs, hard drives, printed circuit boards, and power supplies. Chassis are typically mounted into a rack or cabinet. Using such racks allows chassis that are housing a variety of electronic components to be stored with high space efficiency while permitting easy visual and manual access. Conventional chassis comprising front and rear access panels have traditionally been limited by construction as to which end is accessible for certain connections such as power, input/output, and video. Thus, users have been restricted to either a network setup with front access to particular connections or a lab setup with rear access to particular connections. Traditionally, in order to interchange access between the two ends of the chassis, the user would have to remove and reinstall the components within the chassis, which has drawbacks.

SUMMARY OF THE INVENTION

The present invention relates to a support system comprising a chassis having an interchangeable design and layout. One exemplary embodiment of the present invention comprises a support system including a chassis having a first and second side. The chassis also includes a front panel and a rear panel, each having an outer end and an interior end. The chassis preferably further comprises an outlet segment and an indicator segment, each having two opposed ends. Preferably, the outlet and indicator segments are detachably mounted to the chassis to be interchangeable with each other.

DETAILED DESCRIPTION

The present invention is more particularly described in the following examples that are intended as illustrative only since numerous modifications and variations therein will be apparent to those skilled in the art. As used in the specification and in the claims, "a," "an," or "the" can mean one or more, depending upon the context in which it is used. The preferred embodiment is now described with reference to the figures, in which like numbers indicate like parts throughout the figures.

Figure 1:
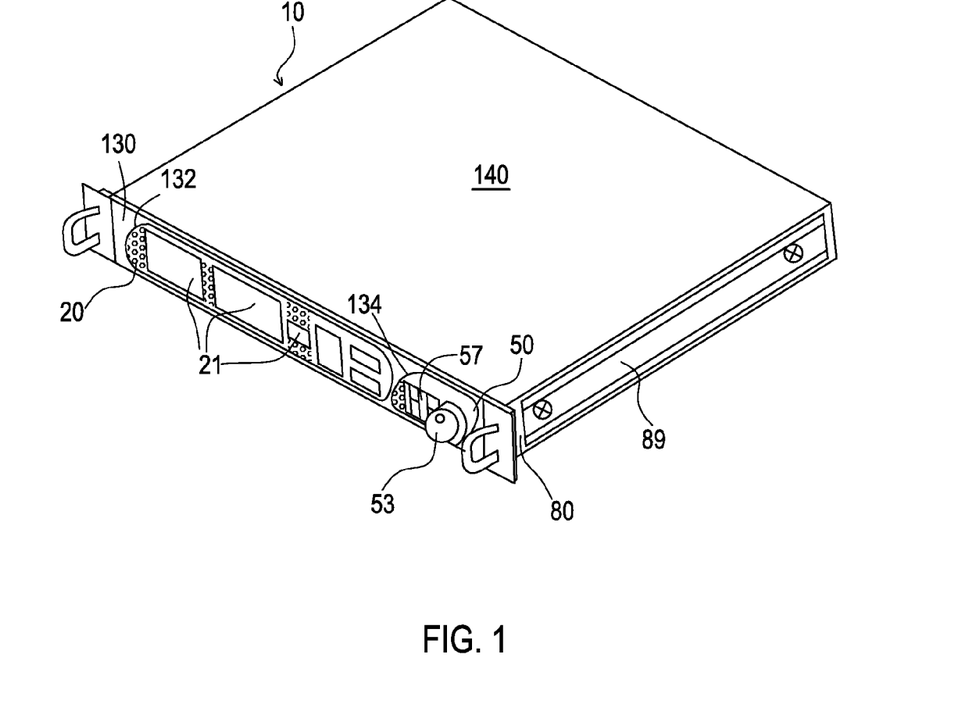
FIG. 1 is a perspective view of a support system comprising a chassis in accordance with one embodiment of the present invention.
Figure 2A:
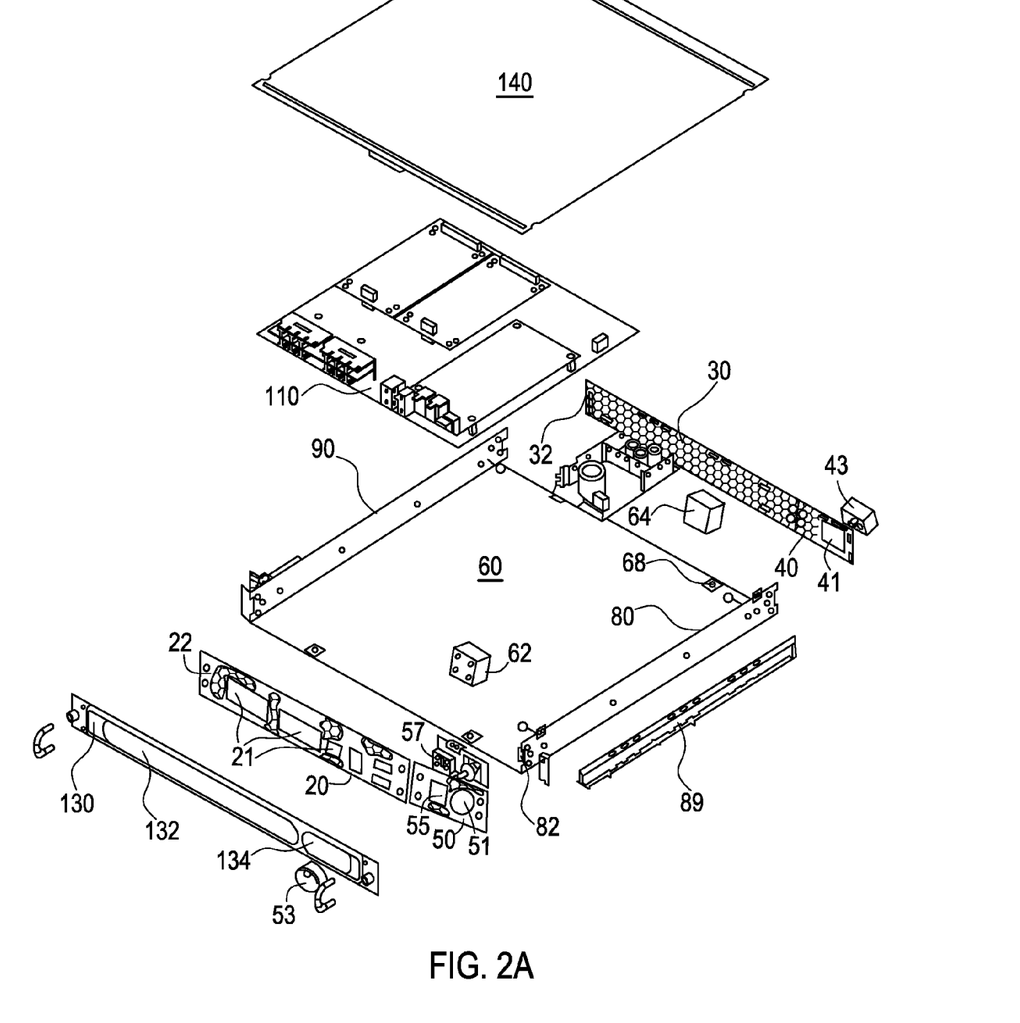
FIG. 2A is an exploded perspective of a support system comprising a chassis having an interchangeable design and layout which includes a motherboard, and a power source.
Figure 2B:
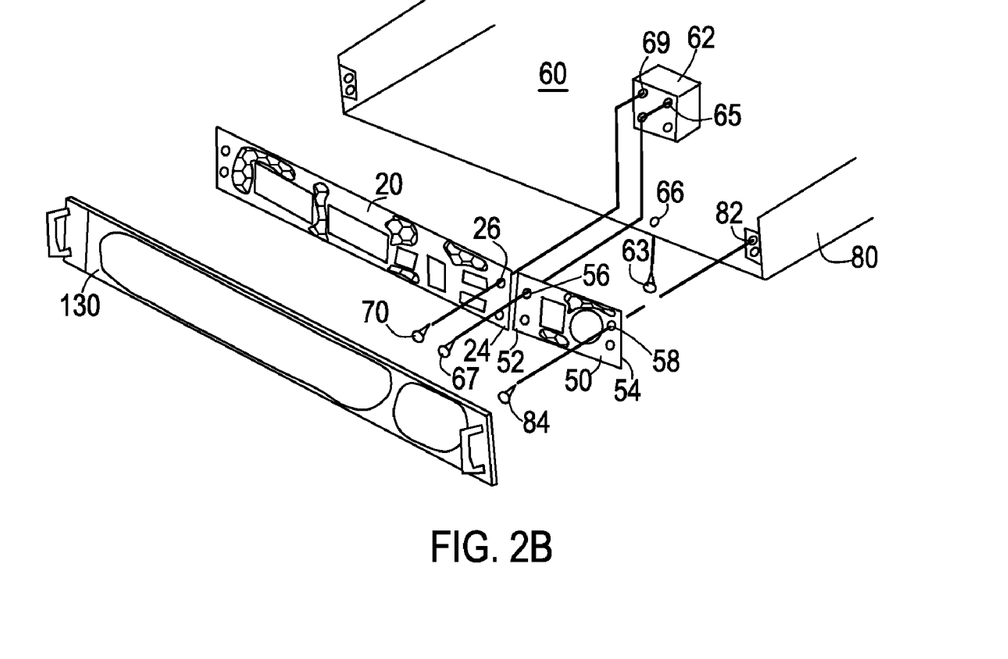
FIG. 2B is a partially exploded front perspective of a connection means of a support system comprising a chassis having an interchangeable design and layout.
Figure 2C:
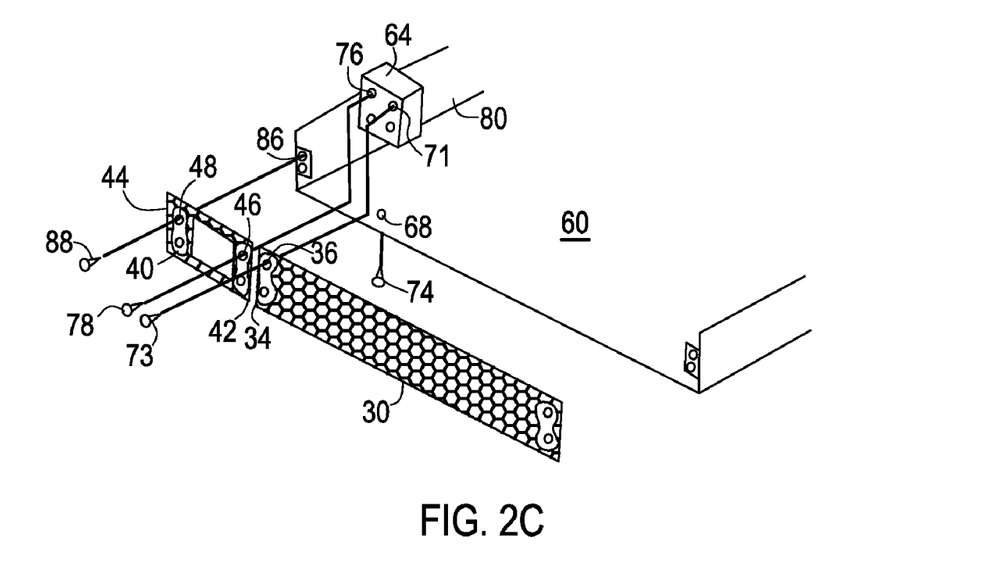
FIG. 2C is a partially exploded rear perspective of a connection means of a support system comprising a chassis having an interchangeable design and layout.
Figure 3A:
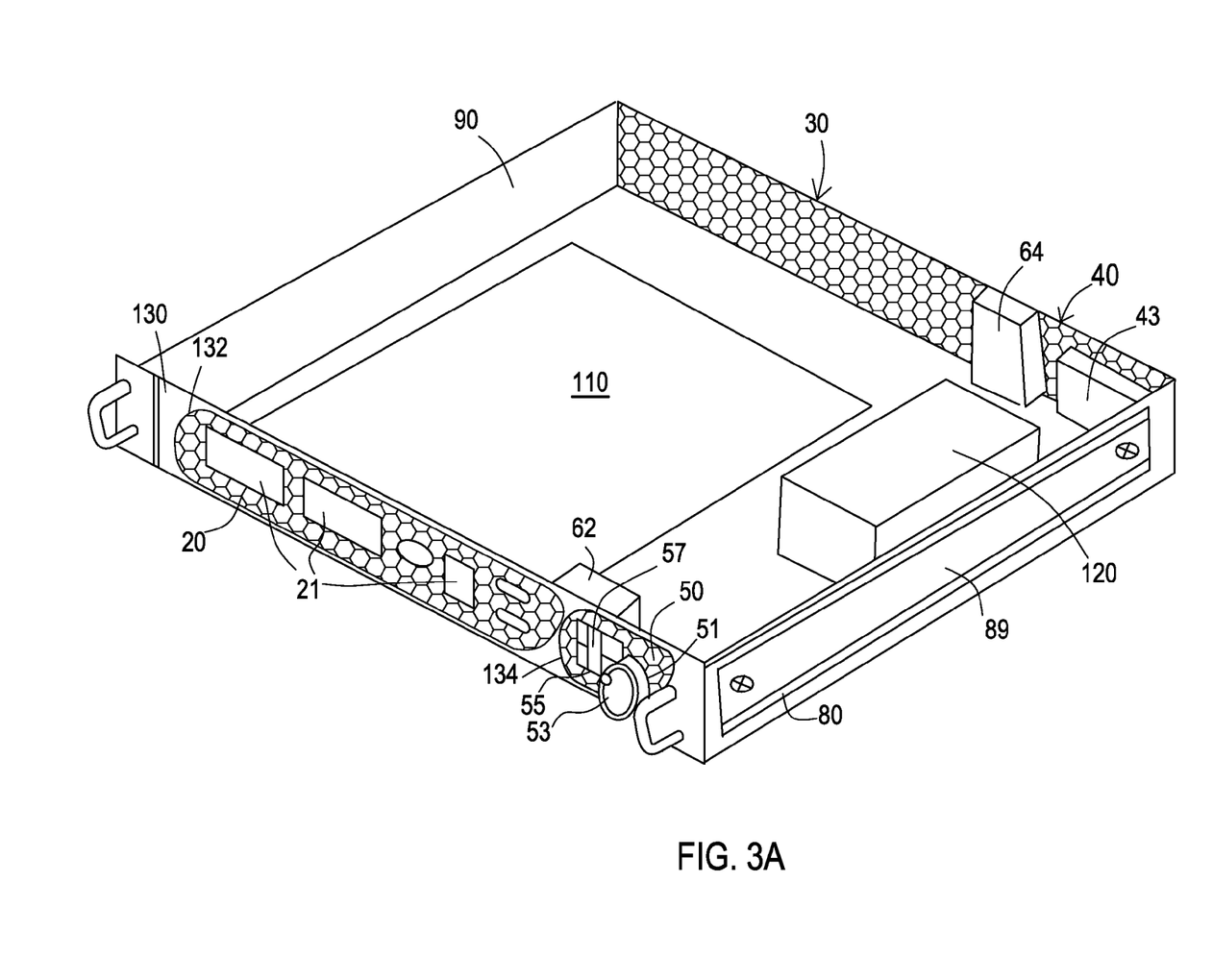
FIG. 3A is a partially exploded perspective view of a support system comprising a chassis having an interchangeable design and layout, wherein the chassis is in the front access position.
Figure 3B:
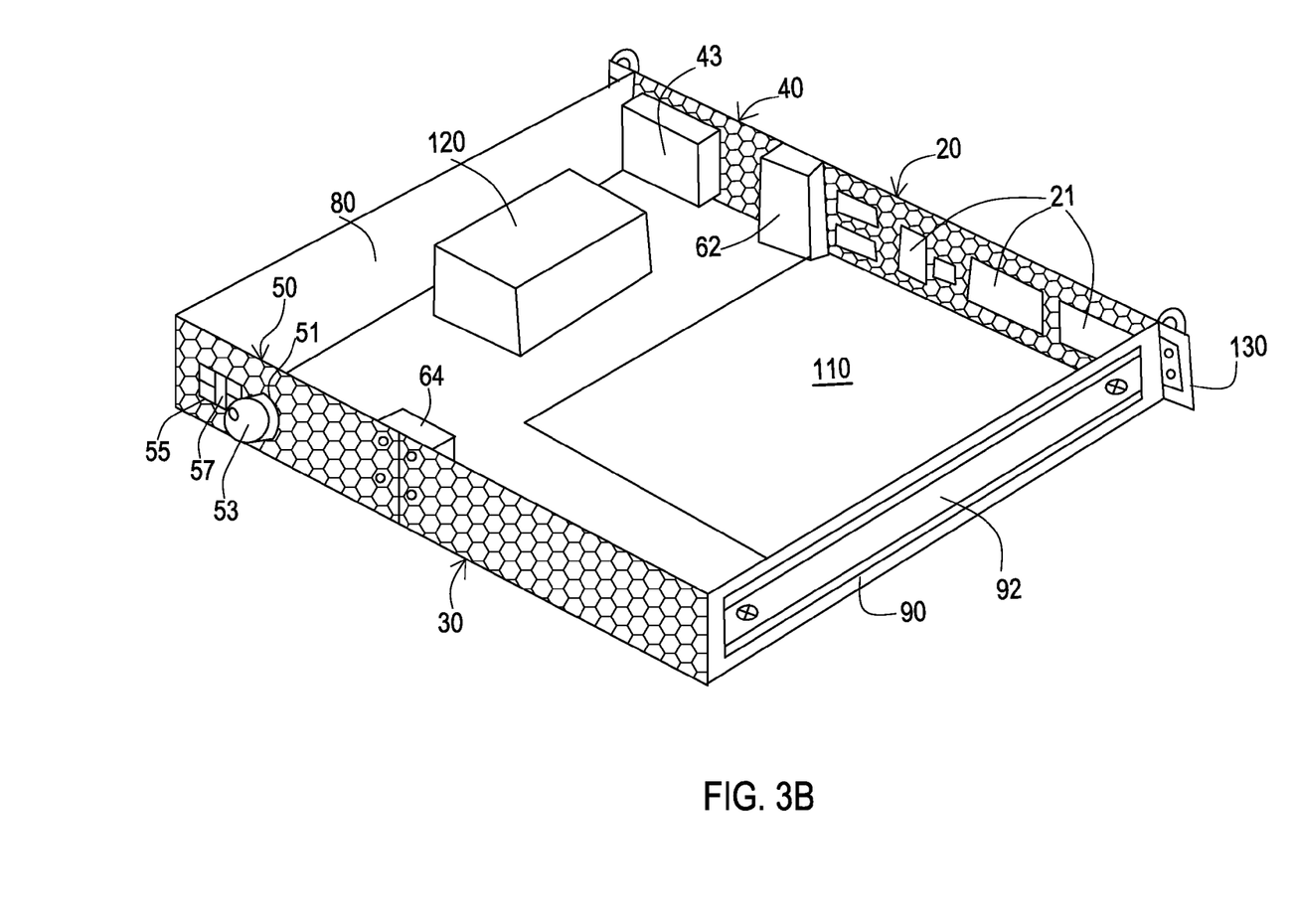
FIG. 3B is a perspective view of a support system comprising a chassis having an interchangeable design and layout, wherein the chassis is in the rear access position.

Referring to the drawings, FIGS. 1-2C illustrate one exemplary embodiment of a support system of the present invention comprising a chassis 10 having an interchangeable design and layout. The chassis 10 preferably has a first side 90, a second side 80, a top 140, and a bottom 60. The support system further comprises a front panel 20 and a rear panel 30. Each of the respective panels 20, 30 includes an outer end and an interior end. The outer end 22 of the front panel 20 is disposed adjacent the first side 90 of the chassis 10, and the interior end 24 of the front panel 20 is disposed intermediate the first side 90 and the second side 80 of the chassis 10. The outer end 32 of the rear panel 30 is disposed adjacent the first side 90 of the chassis 10, and the interior end 34 of the rear panel 30 is disposed intermediate the first side 90 and the second side 80 of the chassis 10. Also the rear panel 30 and the front panel 20 are spaced apart as best illustrated in FIGS. 3A-3B so that electronic/computer components may be positioned therebetween. The distance between the first side 90 and the second side 80 of the chassis 10 defines the length of the chassis. The longest dimension of the first side 90 and second side 80 make up the depth of the chassis 10. In a typical embodiment, the chassis 10 has a length of 17 inches, depth of 20 inches, and a standard height of 1.75 inches (commonly referred to as 1U). In comparison to the length of the chassis 10, the front panel 20 and the rear panel 30 have a preferable length of approximately 12.75 inches, which is about 75% of the length of the chassis 10. As one skilled in the art will appreciate, however, the length of the front and rear panels may vary depending on the design of the chassis.

It is preferred that the support system further comprise an outlet segment 40 and an indicator segment 50 as illustrated in FIG. 2A. Each of the respective segments includes opposed ends—a first end and a second end. The outlet segment 40 and the indicator segment 50 have a preferable length of approximately 4.25 inches which is about 25% of the length of the chassis 10. As one skilled in the art will appreciate, however, the length of the outlet and indicators segments may vary depending on the design of the chassis.

Each of the segments 40, 50 are detachably mounted to the chassis 10 such that the segments 40, 50 are interchangeable between a first position and a second position. That is, when the indicator segment 50 is positioned adjacent the front panel 20 and the outlet segment 40 is positioned adjacent the rear panel 30, as shown in FIG. 3A, the indicator segment 50 and outlet segment 40 are in the first position. Specifically, the first position is achieved when the first end 52 of the indictor segment 50 is positioned adjacent the interior end 24 of the front panel 20, and the first end 42 of the outlet segment 40 is positioned adjacent the interior end 34 of the rear panel 30, as best shown in FIGS. 2B and 2C. The first position also exists when the indicator segment 50 and the outlet segment 40 are twisted around so that the second end 54 of the indicator segment 50 is positioned adjacent the interior end 24 of the front panel 20, and the second end 44 of the outlet segment 40 is positioned adjacent the interior end 34 of the rear panel 30. Alternatively, when the outlet segment 40 is positioned adjacent the front panel 20 and the indicator segment 50 is positioned adjacent the rear panel 30, as shown in FIG. 3B, the outlet segment 40 and the indicator segment 50 are in the second position. That is, the second position is achieved when the first end 42 (or alternatively the second end 44) of the outlet segment 40 is positioned adjacent the interior end 24 of the front panel 20 and the first end 52 (or alternatively the second end 54) of the indicator segment 50 is positioned adjacent the interior end 34 of the rear panel 30.

The segments 40, 50 and the panels 20, 30 preferably are detachably connected to the chassis 10 by a connection means. In the illustrated embodiment, when the segments 40, 50 are in the first position, as shown in FIG. 3A, the indicator segment 50 and the front panel 20 are detachably connected to the chassis 10 by a front fastener 62, and the outlet segment 40 and the rear panel 30 are detachably connected to the chassis 10 by a rear fastener 64. When the segments 40, 50 are in the second position, as illustrated in FIG. 3B, the outlet segment 40 and the front panel 20 are detachably connected to the chassis 10 by the front fastener 62, and the indicator segment 50 and the rear panel 30 are detachably connected to the chassis 10 by the rear fastener 64. Alternatively, the indicator segment 50 may be detachably connected to the chassis 10 by the front fastener 62 and the outlet segment 40 may be detachably connected to the chassis 10 by the rear fastener 64 regardless of whether the segments 40, 50 are in the first or second position. Other connection means are contemplated to detachably connect the segments and the panels to the chassis including but not limited to captive screws, snap hooks, or latches.

As illustrated in FIG. 2B, the front fastener 62 defines at least one first opening 65, at least one second opening 69, and at least one bottom opening. When the segments 40, 50 are in the first position, the first end 52 of the indicator segment 50 defines at least one opening 56 in registry with the first opening 65 of the front fastener 62. Both openings 56, 65 are adapted to receive a first front screw 67 which connects the indicator segment 50 and the front fastener 62 to one another. The indicator segment 50 is similarly connected to the front fastener 62 when the indicator segment 50 is twisted around so that at least one opening 58 of the second end 54 of the indicator segment 50 is in registry with the first opening 65 of the front fastener 62. As for the front panel 20, the interior end 24 of the front panel 20 defines at least one opening 26 in registry with the second opening 69 of the front fastener 62. Both openings 26, 69 are adapted to receive a second front screw 70 which connects the front panel 20 and the front fastener 62 to one another. The front fastener 62 coupled with the indicator segment 50 and the front panel 20 is preferably connected to the chassis 10 by a first bottom screw 63 received through a front opening 66 in the bottom 60 of the chassis 10 and through the bottom opening of the front fastener 62.

As shown in FIG. 2C, the rear fastener 64 defines at least one first opening 76, at least one second opening 71, and at least one bottom opening. The first end 42 of the outlet segment 40 defines at least one opening 46 in registry with the first opening 76 of the rear fastener 64. Both openings 46, 76 are adapted to receive a first rear screw 78 which connects the outlet segment 40 and the rear fastener 64 to one another. The outlet segment 40 is similarly connected to the rear fastener 64 when the outlet segment 40 is twisted around so that at least one opening 48 of the second end 44 of the outlet segment 40 is in registry with the first opening 76 of the rear fastener 64. As for the rear panel 30, the interior end 34 of the rear panel 30 defines at least one opening 36 in registry with the second opening 71 of the rear fastener 64. Both openings 36, 71 are adapted to receive a second rear screw 73 which connects the rear panel 30 and the rear fastener 64 to one another. The rear fastener 64 coupled with the outlet segment 40 and the rear panel 30 is connected to the chassis 10 by a second bottom screw 74 received through a rear opening 68 in the bottom 60 of the chassis 10 and through the bottom opening of the rear fastener 64.

When the segments 40, 50 are in the second position, the opening 46 of the first end 42 (or alternatively the opening 48 of the second end 44) of the outlet segment 40 and the first opening 65 of the front fastener 62 are in registry and are both adapted to receive the first front screw 67 so that the outlet segment 40 and the front fastener 62 are connected to one another. Moreover, the opening 56 of the first end 52 (or alternatively the opening 58 of the second end 54) of the indicator segment 50 and the first opening 76 of the rear fastener 64 are in registry and are both adapted to receive the first rear screw 78 so that the indicator segment 50 and the rear fastener 64 are connected to one another. Other designs are contemplated to couple the segments and panels to the fasteners and the fasteners to chassis including using fusing, soldering, spot welding, chemical adhesives, or other mechanical systems, such as the segments, panels and fasteners having tabs that are complementarily received into respective openings in the fasteners and chassis and then expand to "lock" into position.

As illustrated in FIGS. 2B-2C, the indicator segment 50 and the outlet segment 40 may also detachably connect to the second side 80 of the chassis 10. When the segments 40, 50 are in the first position, as shown in FIG. 2B, the opening 58 of the second end 54 of the indicator segment 50 and at least one front opening 82 of the second side 80 are in registry and are adapted to receive a first screw 84 which connects the indicator segment 50 to the second side 80. The indicator segment 50 is similarly connected to the second side 80 when the indicator segment 50 is twisted around so that the opening 56 of the first end 52 of the indicator segment 50 is in registry with the front opening 82 of the second side 80. As illustrated in FIG. 2C, the opening 48 of the second end 44 of the outlet segment 40 and at least one rear opening 86 of the second side 80 are in registry and are adapted to receive a second screw 88 which connects the outlet segment 40 to the second side 80. The outlet segment 40 is similarly connected to the second side 80 when the outlet segment 40 is twisted around so that the opening 46 of the first side 42 of the outlet segment 40 is in registry with the rear opening 86 of the second side 80.

Moreover, when the segments 40, 50 are in the second position, the opening 58 of the second end 54 (or alternatively the opening 56 of the first end 52) of the indicator segment 50 and the rear opening 86 of the second side 80 are in registry and are adapted to receive the second screw 88 to connect the indicator segment 50 to the second side 80. The opening 48 of the second side 44 (or alternatively the opening 46 of the first side 42) of the outlet segment 40 and the front opening 82 of the second side 80 are in registry and are adapted to receive the first screw 84 to connect the outlet segment 40 to the second side 80.

The front panel 20 of the chassis 10 preferably includes a plurality of input/output ports 21, which may include serial ports, a console adapter for a keyboard, mouse and/or video, a USB port, a PCI slot, etc. The front panel 20 is formed from a metal having a plurality of small openings which allows air to flow in and out of the chassis 10, as illustrated in FIG. 2A. The rear panel 30 is formed from a similar metal having a plurality of small openings to allow air circulate in and out of the chassis 10. The indicator segment includes at least a first orifice 51 and a second orifice 55. It is preferred that a rotary controller 53 and a display device 57 are respectively mounted in the first orifice 51 and the second orifice 55 of the indicator segment 50. Moreover, the first orifice 51 and the second orifice 55 of the indicator segment may vary in shape and size to receive an array of components. The outlet segment 40 of the chassis 10 preferably includes at least one orifice 41 capable of receiving a power jack 43 therethrough.

The present invention allows a user to choose which end of the chassis 10 has access to the plurality of input/output ports 21 of the front panel 20. That is, if the chassis 10 is set up for front access to the plurality of input/output ports 21 (the first position) shown in FIG. 3A, and the user desires the chassis 10 set up for rear access to the plurality of input/output ports 21 (the second position) shown in FIG. 3B, the user may first remove the indicator segment 50 from its coupling with the front fastener 62 and the second side 80 of the chassis 10. Next, the user removes the outlet segment 40 from its coupling with the rear fastener 64 and the second side 80 of the chassis 10. The user then rotates the chassis 10 180 degrees in either a clockwise or counterclockwise direction. Thus, the plurality of input/output ports 21 of the front panel 20 are rotated from a front access position to a rear access position, and the rear panel 30 is rotated from the rear access position to the front access position. The user then connects the indicator segment 50 to the rear fastener 64 and the second side 80 of the chassis 10, which causes the indicator segment to be positioned adjacent to the rear panel 30 as seen in FIG. 3B. To complete the reconfiguration, the user connects the outlet segment 40 to the front fastener 62 and the second side 80 of the chassis 10. Thus, the outlet segment 40 is positioned adjacent the front panel 20 as seen in FIG. 3B. A similar procedure is followed to reconfigure a chassis 10 set up for rear access to the plurality of input/output ports 21 (the second position) to a chassis 10 set up for front access to the plurality of input/output ports 21 (the first position). One skilled in the art will appreciate, however, that the sequence of the steps in changing the layout of the chassis from the front access to the rear access position or from the rear access to the front access position is not limited to that described above, but encompasses any sequence which achieves the indicator segment 50 positioned adjacent the rear panel 30, and the outlet segment 40 positioned adjacent the front panel 20 when converting from the front access to the rear access position, or the indicator segment 50 positioned adjacent the front panel 20, and the outlet segment 40 positioned adjacent the rear panel 30, when converting from the rear access to the front access position.

Figure 4:
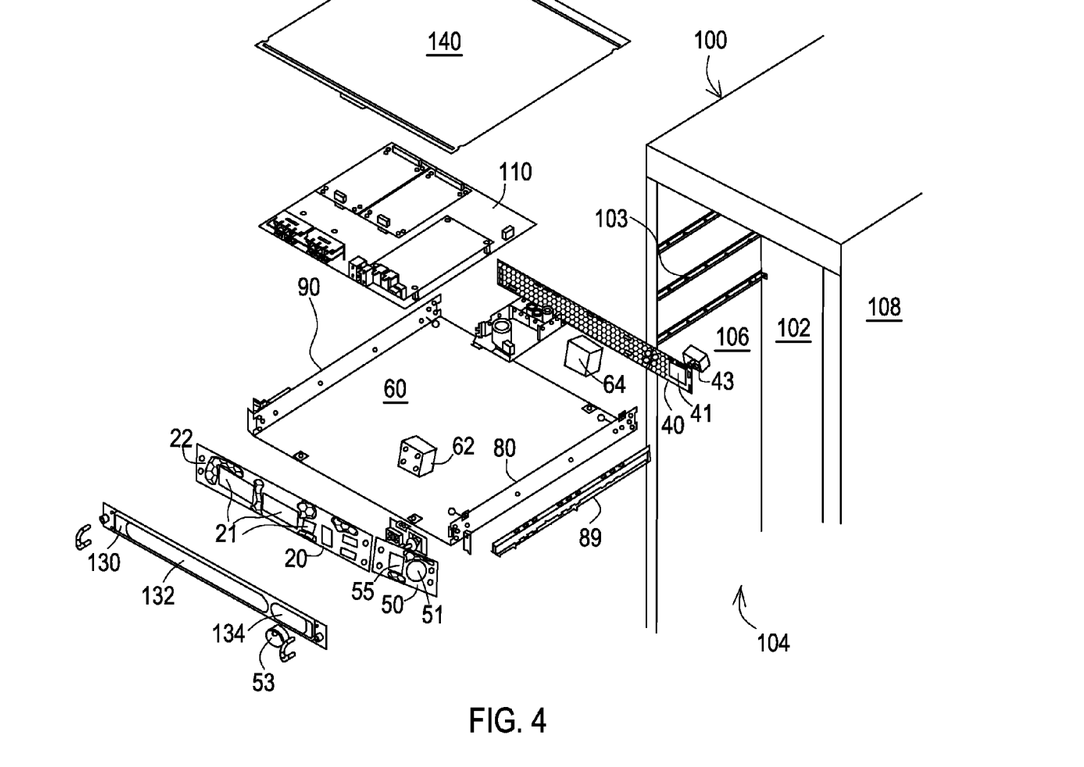
FIG. 4 is an exploded perspective of a support system comprising a chassis having an interchangeable design and layout and including a rack structure in which the chassis is slidably mountable.

The chassis 10 of the present invention may further include a face plate 130 as shown in FIG. 4 to assist a user in removing the support system when it is mounted within a rack system 100. The face plate 130 is detachably connected to the chassis 10 such that when the chassis 10 is set up in the first position, the face plate 130 is located in front of the front panel 20 and the indicator segment 50 as best shown in FIG. 3A, and, alternatively, when the chassis 10 is set up in the second position, the face plate 130 is located in front of the front panel 20 and the outlet segment 40 as illustrated in FIG. 3B. The face plate 130 further includes a first opening 132 having a size to complementarily receive a plurality of input/output connections. Moreover, the face plate 130 preferably includes a second opening 134 having a size to complementarily receive the rotary controller 53 and the display device 57 of the indicator segment 50 as well as the power jack 41 of the outlet segment. When the chassis 10 is in the first position, the face plate 130 is positioned in front of the front panel 20 and the indicator segment 50. When the chassis 10 is in the second position, the face plate 130 is positioned in front of the front panel 20 and the outlet segment 40.

As shown best in FIGS. 3A-3B, the chassis 10 also includes a motherboard 110 located behind the front panel 20 and connected to the bottom 60 of the chassis 10. CPUs and memory cards including static ram (SRAM) or dynamic ram (DRAM) may be mounted on the motherboard 110. When the user changes the layout of the chassis 10 from the first to the second position or from the second to the first position, the location and position of the motherboard 110 remains static. That is, the motherboard 110 remains located behind the front panel 20 and connected to the bottom 60 of the chassis whether the chassis 10 is in the first position or the second position. One skilled in the art will appreciate that the chassis 10 may include a variety of other computer components not specifically discussed by the present invention.

Located adjacent to the motherboard 110 and connected to the bottom 60 of the chassis 10 is a power supply 120. The power supply 120 provides power to the electrical components in the chassis 10. The power supply 120 is also electrically coupled to the power jack 43. Furthermore, the support system is preferably slidably mountable within the rack system 100 in both a first mount position and a second mount position. As illustrated in FIG. 4, the rack system 100 includes an interior side 102, an exterior side 104, a left side 106, and a right side 108. The first side 90 of the chassis 10 includes a first slide rail preferably extending substantially the entire length of the first side 90 of the chassis 10. Similarly, the second side 80 of the chassis 10 includes a second slide rail 89 preferably extending substantially the entire length of the second side 80 of the chassis 10. When the support system is mounted within the rack system 100, the first slide rail and the second slide rail 89 are respectively received by a left track 103 mounted on the left side 106 of the rack system 100 and a right track mounted on the right side 108 of the rack system 100.

It is preferred that when the chassis 10 is in the first position, the support system is mounted within the rack system 100 in the first mount position such that the front panel 20 and the indicator segment 50 of the chassis 10 are located adjacent the exterior side 104 of the rack system 100 and the rear panel 30 and the outlet segment 40 are located adjacent the interior side 102 of the rack system 100. When the chassis 10 is in the second position, the support system is mounted within the rack system 100 in the second mount position such that the rear panel 30 and the indicator segment 50 are located adjacent the exterior side 104 of the rack system and the front panel 20 and the outlet segment 40 are located adjacent the interior side 102 of the rack system 100. Since the support system may be mounted within the rack system 100 in the first and the second mount positions, the user can change the set up of the chassis 10 from the first to the second position or the second to the first position and still mount the support system within the rack system 100.

Although the present invention has been described with reference to specific details of certain embodiments thereof, it is not intended that such details should be regarded as limitations upon the scope of the invention except as and to the extent that they are included in the accompanying claims. For example, the chassis of the present invention may be used outside of the context of electronics.

What is claimed is:

1. A support system comprising:
   a chassis having a first side, a second side, a top and a bottom;
   a front panel having an outer end disposed adjacent the first side of the chassis and an interior end disposed intermediate the first and second sides of the chassis;
   a rear panel having an outer end disposed adjacent the first side of the chassis and an interior end disposed intermediate the first and second sides of the chassis, the rear panel spaced apart from the front panel;
   an outlet segment having two opposed ends, one end disposed adjacent the interior end of a selected one of the front or rear panels and the opposed end disposed adjacent the second side of the chassis; and
   an indicator segment having two opposed ends, one end disposed adjacent the interior end of a selected one of the front or rear panels and the opposed end disposed adjacent the second side of the chassis,
   wherein the outlet and indicator segments are detachably mounted to be interchangeable so that when one end of the indicator segment is disposed adjacent the interior end of the front panel, one end of the outlet segment is disposed adjacent the interior end of the rear panel, and so that when one end of the indicator segment is disposed adjacent the interior end of the rear panel, one end of the outlet segment is disposed adjacent the interior end of the front panel.

2. The support system of claim 1, further comprising a front fastener and a rear fastener that are each mounted to the bottom of the chassis,
   wherein the front fastener detachably connects to the interior end of the front panel and to one end of a selected one of the outlet segment or indicator segment, and
   wherein the rear fastener detachably connects to the interior end of the rear panel and to one end of a selected one of the outlet segment or indicator segment.

3. The support system of claim 2, wherein the front fastener defines at least one bottom opening therein adapted to receive a first bottom screw,
   wherein the rear fastener defines at least one bottom opening therein adapted to receive a second bottom screw,
   wherein the bottom of the chassis defines at least one opening therein adapted to receive the first bottom screw and at least one opening therein adapted to receive the second bottom screw, and
   wherein the bottom openings in the front and rear fasteners are in registry with respective openings in the bottom of the chassis when mounted on the chassis.

4. The support system of claim 2, wherein the front fastener defines at least one opening therein adapted to receive a first front screw,
   wherein the rear fastener defines at least one opening therein adapted to receive a first rear screw,
   wherein one end of the indicator segment defines at least one opening therein adapted to receive a selected one of the first front or rear screws,
   wherein one end of the outlet segment defines at least one opening therein adapted to receive a selected one of the first front or rear screws, and
   wherein the openings in the front and rear fasteners are in registry with respective openings in the indicator and outlet segments when mounted on the chassis.

5. The support system of claim 2, wherein the front fastener defines at least one opening therein adapted to receive a second front screw,
   wherein the rear fastener defines at least one opening therein adapted to receive a second rear screw,
   wherein the interior end of the front panel defines at least one opening therein adapted to receive the second front screw,
   wherein the interior end of the rear panel defines at least one opening therein adapted to receive the second rear screw, and
   wherein the openings in the front and rear fasteners are in registry with respective openings in the front and real panels when mounted on the chassis.

6. The support system of claim 2, further comprising means for detachably connecting the fasteners to the respective front and rear panels and also to the respective indicator and outlet segments.

7. The support system of claim 1, wherein the indicator and outlet segments are each detachably connected to the second side of the chassis.

8. The support system of claim 7 wherein the second side of the chassis defines at least one front opening therein adapted to receive a first screw and at least one rear opening therein adapted to receive a second screw,
   wherein one end of the indicator segment defines at least one opening therein adapted to receive a selected one of the first or second screws,
   wherein one end of the outlet segment defines at least one opening therein adapted to receive a selected one of the first or second screws, and
   wherein the openings in the second side of the chassis are in registry with respective openings in the indicator and outlet segments when mounted on the chassis.

9. The support system of claim 1, wherein the indicator segment defines at least two orifices therethrough, the orifices of a size to each complementarily receive respectively a rotary controller and a display device.

10. The support system of claim 1, wherein the outlet segment defines an orifice therethrough of a size to complementarily receive a power jack.

11. The support system of claim 1, wherein the front panel defines a plurality of orifices therethrough of a size to each complementarily receive an input/output connection.

12. The support system of claim 1, wherein the chassis is adapted to receive a motherboard on its bottom.

13. The support system of claim 1, wherein the chassis is adapted to receive a power supply disposed on the bottom of the chassis adjacent the motherboard.

14. The support system of claim 1, wherein the rear panel defines a plurality of openings therethrough of a size to allow a flow of air to enter and exit the chassis.

15. The support system of claim 1, wherein the chassis has a length extending between its first and second sides,
   wherein the front and rear panels each have a length extending between their respective outer and interior ends,
   and wherein the length of the front and rear panels is each approximately seventy-five percent the length of the chassis.

16. The support system of claim 15, wherein the indicator and outlet segments each have a length extending between their respective opposed ends, and
   wherein the length of the indicator and outlet segments is each approximately twenty-five percent the length of the chassis.

17. The support system of claim 1, wherein the chassis further comprises a first slide rail and a second slide rail that are adapted to be slidably received within a rack that has an exterior side and an interior side.

18. The support system of claim 17, wherein the chassis is slidably mountable both in a first position and in a second position within a rack system having an exterior side and an interior side, wherein, when the chassis is in the first position, the front panel and the indicator segment are located adjacent the exterior side of the rack and the rear panel and the outlet segment are located adjacent the interior side of the rack, and wherein, when the chassis is in the second position, the rear panel and the indicator segment are located adjacent the exterior side of the rack and the front panel and the outlet segment are located adjacent the interior side of the rack.

19. A support system comprising:

a chassis having a first side, a second side, a top and a bottom;

a front panel having an outer end disposed adjacent the first side of the chassis and an interior end disposed intermediate the first and second sides of the chassis;

a rear panel having an outer end disposed adjacent the first side of the chassis and an interior end disposed intermediate the first and second sides of the chassis, the rear panel spaced apart from the front panel;

a motherboard positioned on the bottom of the chassis intermediate the front panel, rear panel, first side, and second side;

a power supply disposed on the bottom of the chassis adjacent the motherboard;

an outlet segment having two opposed ends, one end disposed adjacent the interior end of a selected one of the front or rear panels and the opposed end disposed adjacent the second side of the chassis;

an indicator segment having two opposed ends, one end disposed adjacent the interior end of a selected one of the front or rear panels and the opposed end disposed adjacent the second side of the chassis; and a face plate juxtaposed to the front panel and to a selected one of the indicator or outlet segments, the face plate defining a first opening therethrough of a size to complementarily receive a plurality of input/output connections and a second opening therethrough of a size to complementarily receive a selected one of a rotary controller and a display device or a power jack, wherein the outlet and indicator segments are detachably mounted to be interchangeable so that when one end of the indicator segment is disposed adjacent the interior end of the front panel, one end of the outlet segment is disposed adjacent the interior end of the rear panel, and so that when one end of the indicator segment is disposed adjacent the interior end of the rear panel, one end of the outlet segment is disposed adjacent the interior end of the front panel.

20. The support system of claim 19, further comprising a front fastener and a rear fastener that are each mounted to the bottom of the chassis, wherein the front fastener detachably connects to the interior end of the front panel and to one end of a selected one of the outlet segment or indicator segment, and wherein the rear fastener detachably connects to the interior end of the rear panel and to one end of a selected one of the outlet segment or indicator segment.

* * * * *